(12) United States Patent
Fiori et al.

(10) Patent No.: US 9,356,090 B2
(45) Date of Patent: May 31, 2016

(54) PMOS TRANSISTOR WITH IMPROVED MOBILITY OF THE CARRIERS

(71) Applicants: STMicroelectronics (Crolles 2) SAS, Crolles (FR); STMicroelectronics SA, Montrouge (FR)

(72) Inventors: Vincent Fiori, Sassenage (FR); Sebastien Gallois-Garreignot, Grenoble (FR); Denis Rideau, Grenoble (FR); Clement Tavernier, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 14/640,705

(22) Filed: Mar. 6, 2015

(65) Prior Publication Data

US 2015/0311277 A1 Oct. 29, 2015

(30) Foreign Application Priority Data

Apr. 25, 2014 (FR) ...................................... 1453723

(51) Int. Cl.
*H01L 29/04* (2006.01)
*H01L 29/78* (2006.01)

(52) U.S. Cl.
CPC .......... *H01L 29/045* (2013.01); *H01L 29/7845* (2013.01)

(58) Field of Classification Search
CPC ................................................... H01L 29/1033
See application file for complete search history.

(56) References Cited

U.S. PATENT DOCUMENTS

2009/0230439 A1 9/2009 Wang et al.
2010/0148223 A1 6/2010 Jin

OTHER PUBLICATIONS

INPI Search Report and Written Opinion for FR 1453723 dated Dec. 18, 2014 (7 pages).

*Primary Examiner* — Lex Malsawma
(74) *Attorney, Agent, or Firm* — Gardere Wynne Sewell LLP

(57) ABSTRACT

A substrate includes an active region oriented along a crystallographic face (100) and limited by an insulating region. A MOS transistor includes a channel oriented longitudinally along a crystallographic direction of the <110> type. A basic pattern made of metal and formed in the shape of a T is electrically inactive and situated over an area of the insulating region adjacent a transverse end of the channel. A horizontal branch of the T-shaped basic pattern is oriented substantially parallel to the longitudinal direction of the channel.

20 Claims, 6 Drawing Sheets

PMOS TRANSISTOR WITH IMPROVED MOBILITY OF THE CARRIERS

PRIORITY CLAIM

This application claims priority from French application for Patent No. 1453723 filed Apr. 25, 2014, the disclosure of which is incorporated by reference.

TECHNICAL FIELD

The invention relates to integrated circuits and, more particularly, to improving the performance characteristics of PMOS transistors, in particular the mobility of the carriers.

BACKGROUND

In an integrated circuit, the transistors are formed within and on an active semiconductor region, for example silicon, surrounded by an electrically-insulating region, for example a trench filled for example with silicon dioxide, in particular of the shallow trench isolation (or STI) type.

The formation of an MOS transistor inside of an insulating region may (depending on the thermal expansion coefficient of the insulating material and on the deposition temperature) lead to the formation of an active region with compressive stress owing to the presence at its periphery of the insulating region.

Although an active region with compressive stress favors the performance characteristics of a PMOS transistor in certain directions, notably in terms of mobility of the carriers, there exists a need to further improve these performance characteristics, notably in terms of mobility.

SUMMARY

According to one embodiment, an improvement in the mobility of the carriers of a PMOS transistor is provided by disposing a dummy metal pattern in the neighborhood of at least one transverse end of the channel of a PMOS transistor oriented at 45° with respect to the orientation of the substrate, which is equivalent to a PMOS transistor disposed on a substrate rotated by 45°.

According to one aspect, an integrated circuit is provided, comprising, within a substrate containing silicon and oriented along the crystallographic face (100), at least one active region bounded by an insulating region and at least one PMOS transistor situated within and on the active region.

According to a general characteristic of this aspect, the channel of the PMOS transistor is oriented longitudinally along a crystallographic direction of the <110> type, and the integrated circuit furthermore comprises at least one basic pattern in the shape of a T, electrically inactive, situated on top of at least one area of the insulating region situated in the neighborhood of at least one transverse end of the channel, the horizontal branch of the T being substantially parallel to the longitudinal direction of the channel.

An area of the insulating region situated in the neighborhood of one end of the channel of the transistor may be understood as an area separated from the end of the channel by a distance which is of the same order of magnitude as the minimum distance permitted by the design rules (DRM: Design Rules Manual) for the integrated circuit, between the edge of an electrically-conducting contact and the end of the channel of a transistor. In other words this distance can be in the range between once and about ten times the minimum distance, and preferably equal to this minimum distance.

A crystallographic direction of the <110> type comprises a whole family of equivalent crystallographic directions. However, as the channel of a transistor is parallel to the upper face of the substrate, the channel of the PMOS transistor is of course oriented longitudinally along a crystallographic direction of the <110> type contained within or parallel to the crystallographic face (100).

Thus, the combination of a PMOS transistor, whose channel is oriented in such a crystallographic direction, in other words for example at 45° with respect to the orientation of the substrate or else disposed on a substrate rotated by 45°, and of at least one such basic pattern in the shape of a T situated in the neighborhood of at least one transverse end of the channel, allows the compressive stresses in the longitudinal direction of the channel and the tensile stresses in the transverse direction of the channel to be increased, which further improves the mobility of the carriers of the PMOS transistor within the channel.

The horizontal branch of the T is preferably located between the corresponding end of the channel and the vertical branch of the T. In other words, the T is preferably oriented in such a manner that the horizontal branch is nearer to the channel than to the vertical branch.

Although at least a part of the vertical branch of the T is situated in the transverse extension of the channel, in other words the vertical branch of the T can be shifted longitudinally with respect to the transverse axis of the channel, it is preferable for the axis of symmetry of the vertical branch of the T to be substantially aligned with the transverse axis of the channel.

The horizontal branch of the T leads to compressive stresses in the longitudinal direction of the channel, whereas the vertical branch of the T leads to tensile stresses in the transverse direction of the channel. Those skilled in the art will know how to adjust the dimensions of these branches of the T in such a manner as to effectively allow this effect. However, by way of example, it is preferable for the width of the horizontal branch of the T, measured in the transverse direction of the channel, to be less than or equal to one third of the length of this horizontal branch measured in the longitudinal direction of the channel.

Similarly, it is preferable for the width of the vertical branch of the T, measured in the longitudinal direction of the channel, to be substantially equal to the length of the channel.

The at least one basic pattern advantageously has a thermal expansion coefficient greater than that of the surrounding dielectric material and is for example made of metal.

Several solutions are possible for forming this basic pattern.

According to one possible embodiment, the at least one basic pattern can rest on the area of insulating region and then run between the insulating region area and the at least one metallization level, typically the first metallization level.

In other words, such a basic pattern is then equivalent to a "contact", which is of course a dummy contact since this basic pattern is electrically inactive and, in other words, not electrically connected to any potential. This basic pattern may then be formed, with a modification of the "contacts" mask, in conjunction with the formation of the effective contacts taken for example on the gate, source and drain regions of the transistors.

The basic pattern may then comprise tungsten.

However, when the gate region encroaches onto the insulating region, and there is consequently no room for disposing the basic pattern on this insulating region in the neighborhood of a transverse end of the channel, the at least one basic pattern may be situated directly above the area of insulating region on at least one metallization level, for example on the first metallization level.

Generally speaking, an integrated circuit comprises several metallization levels. Thus, according to one embodiment, the at least one assembly can comprise the at least one basic pattern and at least one other pattern stacked with the at least one basic pattern. This other pattern is advantageously geometrically analogous to the basic pattern and is situated at one of the at least one metallization levels, the assembly still being electrically inactive.

This other pattern can thus be directly in contact with the basic pattern when the latter is directly resting on the insulating region or else be connected to the basic pattern by at least one via when, for example, the basic pattern is situated at the first metallization level and when the other pattern is situated at the second metallization level. The via is also advantageously in the shape of a T.

When the basic pattern and at least one other pattern are respectively situated at different metallization levels, these patterns and the via or vias, where present, can comprise copper or aluminum.

BRIEF DESCRIPTION OF THE DRAWINGS

Others advantages and features of the invention will become apparent upon examining the detailed description of non-limiting embodiments and the appended drawings in which.

DETAILED DESCRIPTION OF THE DRAWINGS

A crystalline structure is described by a lattice and a pattern. The lattice is a periodic and regular arrangement of points in space, whereas the pattern is a base of atoms in the elementary mesh of the lattice which is repeated in an identical fashion along the three base vectors of the lattice.

Figure 1:
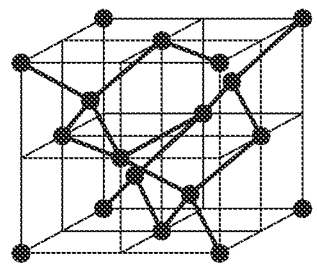
FIGS. 1 to 4 illustrate schematically certain crystallographic features of silicon.

In the case of silicon, the crystalline structure is of the diamond cubic type as illustrated schematically in FIG. 1. The atoms of silicon occupy the positions of a face-centered cubic lattice with atoms of silicon occupying one tetrahedral site in two of the mesh.

The face-centered cubic lattice has eight tetrahedral sites that can accommodate others atoms which leads to the existence of crystallographic planes or faces that may be more or less dense. In the case of silicon, four of the eight sites are occupied in a cube.

As is well known to those skilled in the art, the crystallographic planes and directions of a crystalline structure are defined by using a mathematical description known by the expression "Miller indices". Thus, the direction [hkl] defines a vector or direction orthogonal to the surface of a particular plan or face.

The notation {hkl} defines a family of planes or faces and the notation (hkl) defines a particular plane or face.

Figure 2:
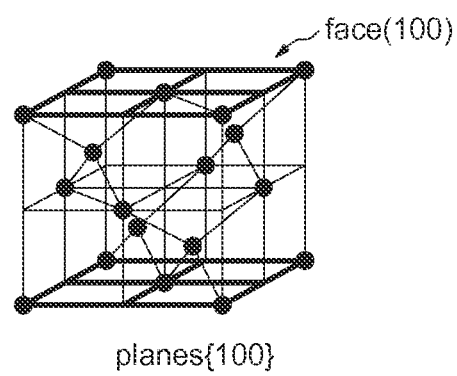

Thus, FIG. 2 illustrates a family of planes {100} comprising, in bold, the face or plane (100).

Generally speaking, the electronics industry conventionally and preferentially uses substrates of silicon oriented according to the crystallographic face (100).

Figure 3:
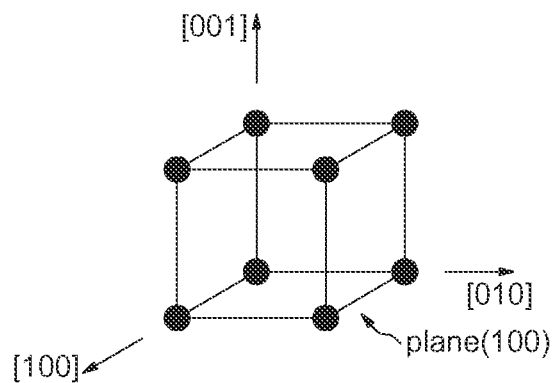

As illustrated very schematically in FIG. 3, in which the crystalline structure of silicon has been simplified for the sake of clarity, directions of the <100> type may be associated for a plane or crystallographic face (100). This notation < > allows a family of equivalent directions to be identified.

Thus, in FIG. 3, the type <100> comprises the equivalent directions [100], [010], [001].

The type <110> includes the following equivalent directions:
[110], [011], [101],
[−1−10], [0−1−1], [−10−1],
[−110], [0−11], [−101],
[1−10], [01−1], [10−1]

Figure 4:
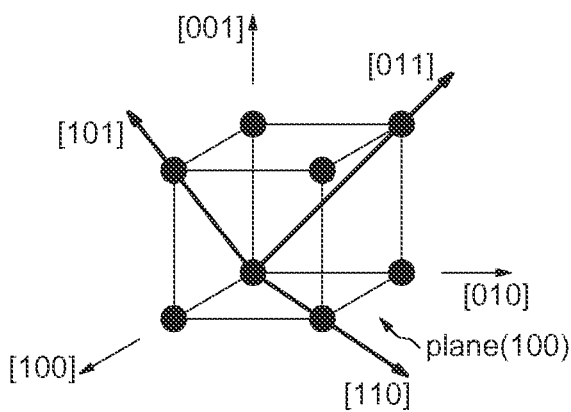

Certain of these directions are illustrated in FIG. 4, and it can be seen that some of these directions are not contained in or are not parallel to the crystallographic plane (100), whereas other directions are, such as for example the directions [110] [−1−10] [−110] [1−10].

In the following part of the description, it will be considered that the integrated circuit comprises a silicon substrate oriented along the crystallographic face (100) and incorporating at least one PMOS transistor whose channel is oriented longitudinally according to a crystallographic direction of the <110> type.

Of course, given that the channel of the transistor is parallel to the face of the substrate, a crystallographic direction of the <110> type for the longitudinal orientation of the channel is a direction of the <110> type contained within or parallel to the crystallographic face (100), for example the direction [110].

Figure 5:
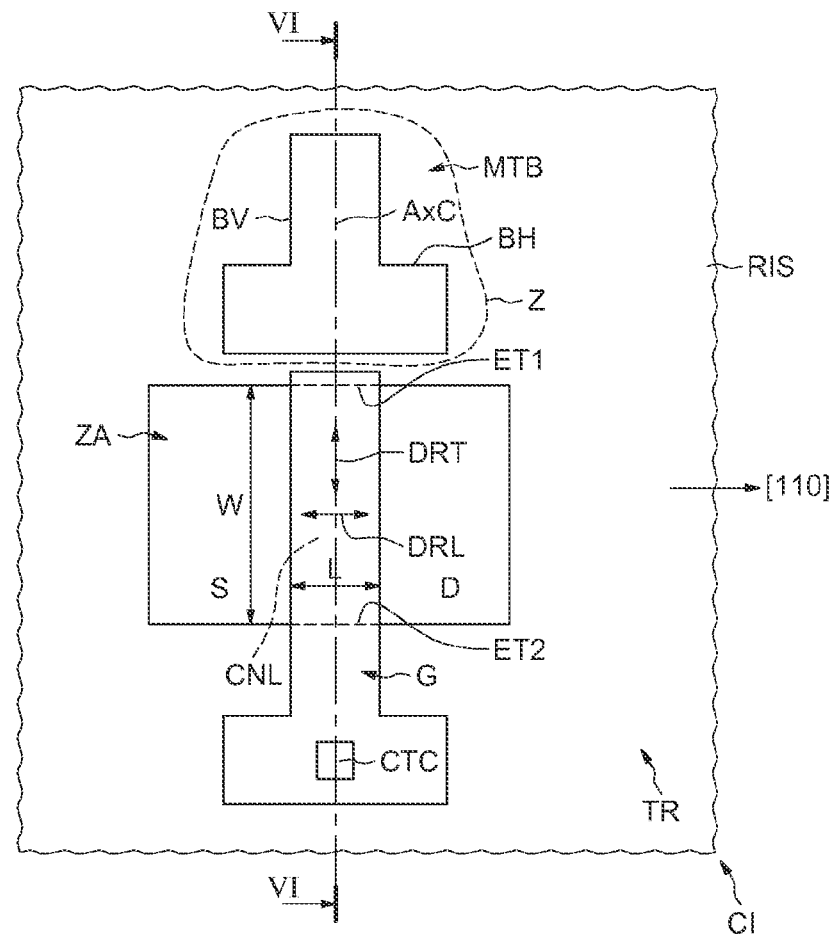
FIGS. 5 to 12 illustrate schematically various embodiments of an integrated circuit.
Figure 6:
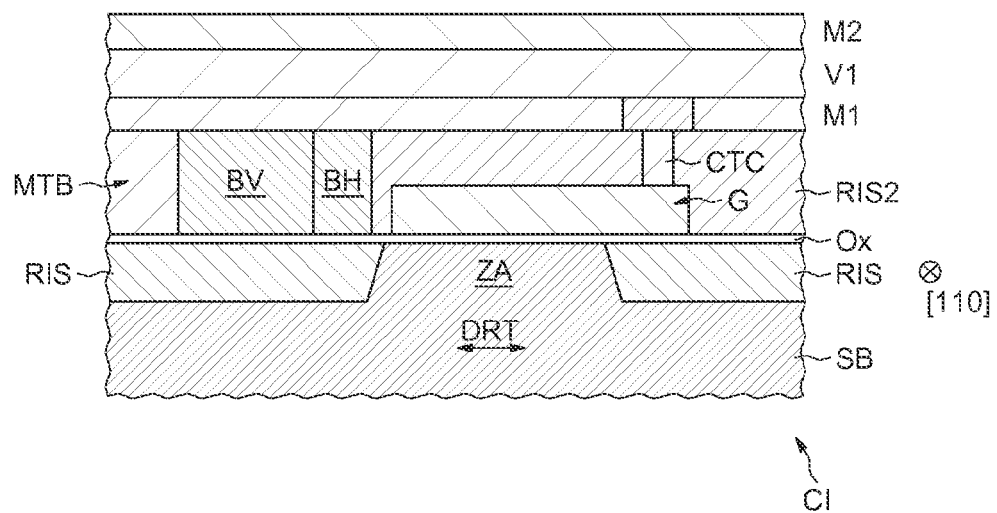

This is illustrated in FIG. 5 and in FIG. 6 which is a cross section along the line VI-VI in FIG. 5.

In these figures, the integrated circuit CI comprises, within the substrate SB comprising silicon and oriented along the crystallographic face (100), an active region ZA limited by an insulating region RIS, for example of the shallow trench isolation (or STI) type.

A PMOS transistor TR is situated within and on the active region ZA.

This active region ZA comprises the source S and drain D regions of the transistor TR together with the channel CNL of the transistor running longitudinally in the direction DRL (corresponding to the crystallographic direction [110]) between the source and drain regions S and D.

In these FIGS. 5 and 6, the reference DRT denotes the transverse direction of the channel CNL, which is orthogonal to the longitudinal direction DRL.

The channel CNL therefore has two transverse ends ET1 and ET2.

The transistor TR also comprises a gate region G, for example made of polysilicon, separated from the active region ZA by a gate oxide OX, for example made of silicon dioxide.

The dimension L denotes the length of the channel measured in the direction DRL and the dimension W denotes the width of the channel measured in the transverse direction DRT.

A metal contact CTC, for example made of tungsten, allows a contact to be made with the gate G. Similarly, other contacts, not shown in these figures for the purposes of simplification, allow contacts to be made with the source and drain regions S and D of the transistor.

The integrated circuit CI furthermore comprises a basic pattern MTB in the shape of a T, electrically inactive, situated on top of an area Z of the insulating region RIS here situated in the neighborhood of the transverse end ET1 of the channel. The horizontal branch BH of the T is substantially parallel to the longitudinal direction DRL of the channel whereas the vertical branch BV of the T, oriented in the transverse direction DRT, has its axis of symmetry AxC substantially aligned with the transverse axis of the channel CNL.

As illustrated more particularly in FIG. 6, the integrated circuit CI comprises an interconnection part (commonly denoted by those skilled in the art under the acronym BEOL: Back End Of Line), comprising several metallization levels only two of which, namely the first metallization level and the second metallization level M1, M2, are shown here for the purposes of simplification. Each metallization level comprises metal tracks allowing the interconnection of the various components of the integrated circuit. These metallization levels are separated by levels of vias, of which only the first level V1 is shown here for the purposes of simplification. The via level of V1 comprises various vias allowing tracks of the adjacent metallization levels M1, M2 to be connected together.

The various tracks of the metallization levels together with the vias are encapsulated in an insulating material commonly denoted by those skilled in the art by the term Inter Metal Dielectric (IMD).

Furthermore, the contacts such as the contact CTC, allowing contacts to be made between the electrically active regions of the various components at the first metallization level, are encapsulated in an insulating region RIS2.

In addition, it can be seen here that the basic pattern MTB is also encapsulated in the insulating region RIS2 between the layer of gate oxide OX which covers the upper surface of the substrate and the first metallization level M1.

This basic pattern MTB is thus formed in conjunction with the formation of the contacts CTC by a modification of the "contacts" mask. It is thus formed with the same metal as that filling the contacts CTC, for example tungsten. In this case, a basic pattern MTB situated in the neighborhood of one end of the channel of the transistor may be understood as a pattern whose distance between the horizontal branch of the T and the end of the channel is of the same order of magnitude as the minimum distance permitted by the design rules for the integrated circuit (DRM) between the edge of a contact and the end of the channel of a transistor. In other words this distance can be in the range between once and around ten times the minimum distance, and preferably equal to this minimum distance.

The pattern MTB is electrically inactive, in other words not connected to any potential or component of the integrated circuit CI.

The horizontal branch BH of the T induces compressive stresses in the channel of the PMOS transistor in the longitudinal direction DRL, whereas the vertical branch BV of the T induces tensile stresses in the transverse direction DRT.

Accordingly, this therefore promotes the mobility of the carriers of the PMOS transistor.

Those skilled in the art will be able to choose the geometrical dimensions of the T in such a manner as to effectively obtain an addition of the compressive stresses in the longitudinal direction DRL of the channel and of the tensile stresses in the direction DRT of the channel.

Figure 7:
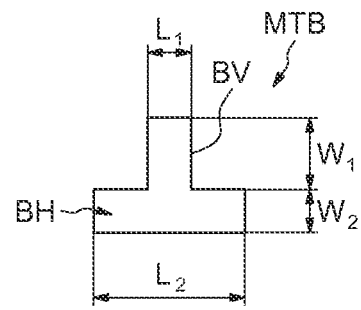

Thus, by way of example, the width W2 (FIG. 7) of the horizontal branch BH of the T, measured in the transverse direction DRT of the channel, is advantageously less than or equal to one third of the length L2 of this horizontal branch, measured in the longitudinal direction of the channel.

Furthermore, the width L1 of the vertical branch BV of the T, measured in the longitudinal direction of the channel, is advantageously substantially equal to the length L of the channel.

As far as the length L2 of the horizontal branch of the T is concerned, it may be taken equal to the maximum admissible length taking into account the local overall dimensions of the integrated circuit. Similarly, the length W1 of the vertical branch of the T may also be equal to the maximum permitted value taking into account the local overall dimensions of the integrated circuit.

The variation in mobility induced is thus of the order of 10% in the region close to the pattern in the shape of a T.

Figure 8:
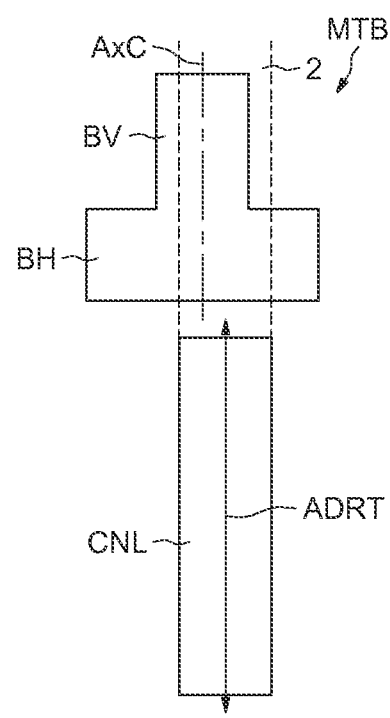

Whereas, in FIG. 5, the axis of symmetry of the vertical branch of the T was substantially aligned with the transverse axis of the channel, it is possible, as illustrated in FIG. 8, for the basic pattern MTB to be slightly offset longitudinally with respect to the transverse axis ADRT of the channel as long as at least a part of the vertical branch BV of the T is situated in the transverse extension 2 of the channel. Such an embodiment may be envisaged when, for example, the local overall dimensions of the integrated circuit does not allow an alignment of the vertical branch of the T on the channel, potentially with a less efficient generation notably of tensile stresses in the transverse direction of the channel.

Figure 9:
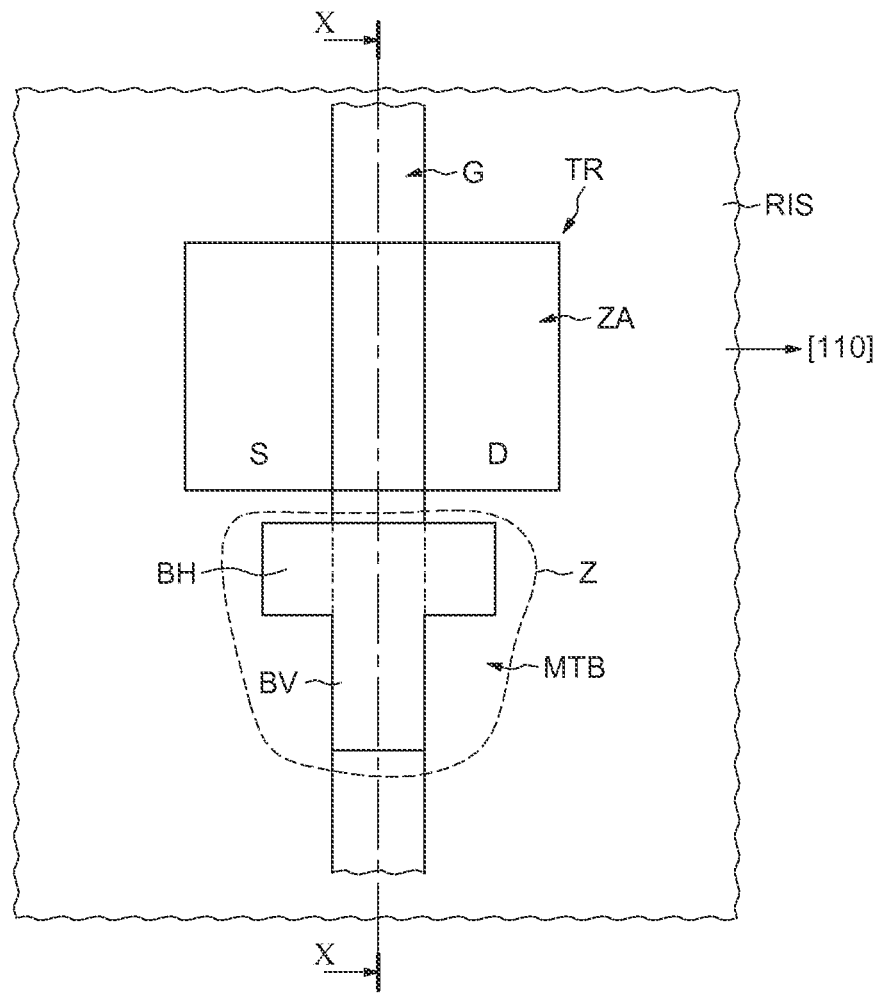

In the embodiment in FIG. 9, it is assumed that the gate region G of the transistor TR encroaches on top of at least one area Z of the insulating region RIS situated in the neighborhood of at least one transverse end of the channel. In this case, it is not of course possible to make the basic pattern MTB rest directly on the insulating region RIS.

Figure 10:
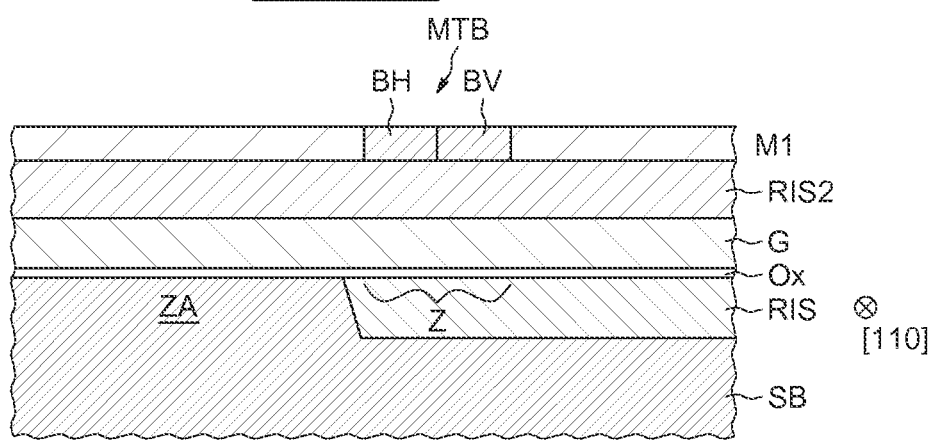

Accordingly, as illustrated in FIG. 9 and in FIG. 10 which is a cross section along the line X-X of the FIG. 9, the idea is to dispose the basic pattern MTB directly above the area Z on a metallization level, for example the first metallization level M1. The placement of such a pattern on a metallization level directly above the area Z also allows, but to a lesser extent, compressive stresses to be generated in the longitudinal direction of the channel and tensile stresses in the transverse direction of the channel.

Of course, although, in FIGS. 9 and 10, only a single pattern MTB is shown directly above a region situated at a single transverse end of the channel, it would be possible to dispose a pattern MTB directly above both areas Z situated in the neighborhood of the two transverse ends of the channel.

It would also be possible to combine the embodiment of FIGS. 5 and 6 with the embodiment of FIGS. 9 and 10, in other words to place at one transverse end of the channel a pattern MTB resting directly on the area Z of the insulating region and another pattern MTB situated at the first metallization level directly above the area Z of the insulating region situated at the other transverse end of the channel.

Figure 11:
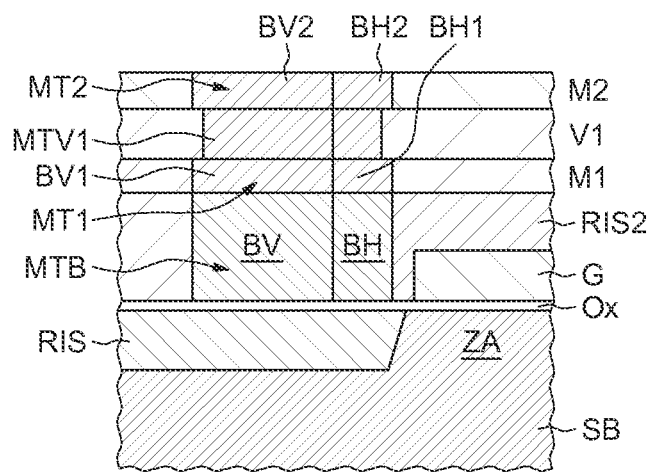
Figure 12:
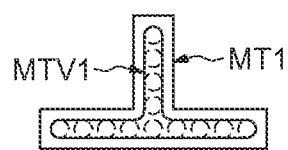

It is also possible, as illustrated in FIGS. 11 and 12, to form a stack, electrically inactive, comprising a basic pattern MTB and at least one other pattern MT1, MT2.

In the embodiment of FIG. 11, the basic pattern MTB rests directly on the corresponding area of the insulating region RIS and the stack comprises another pattern MT1 here disposed at the metallization level M1 also in the shape of a T, resting on the pattern MTB together with another pattern MT2 disposed at the metallization level M2 and connected to the pattern MT1 by a via MTV1.

Although it would have been possible to only use a single conventional via between the two patterns MT1 and MT2, it is particularly advantageous, as illustrated in FIG. 12, to use a via MTV1 also in the shape of a T in such a manner as to further reinforce the intensity of the compressive and tensile stresses introduced into the active region of the transistor. Such a via in the shape of a T may be obtained by a conventional design of vias very closely spaced so that, once etched, they become connected so as to thus form a continuous line in the shape of a T.

The conventional design rules (DRM: Design Rules Manual) are thus violated, but it is possible to set up dedicated rules/derogations. Such derogations are already commonly applied in certain areas of the circuit, at the peripheries of the product for example.

What is claimed is:

1. An integrated circuit, comprising:
a substrate containing silicon;
at least one active region oriented along a crystallographic face (100) of the substrate and limited by an insulating region;
at least one PMOS transistor situated within and on the active region, the PMOS transistor having a channel oriented longitudinally along a crystallographic direction of the <110> type; and
at least one basic pattern in the shape of a T which is electrically inactive and situated above at least one area of the insulating region situated adjacent at least one transverse end of the channel;
wherein the T shape of the basic pattern includes a horizontal branch oriented substantially parallel to a longitudinal direction of the channel.

2. The integrated circuit according to claim 1, wherein the T shape of the basic pattern includes a vertical branch, and wherein a part of the vertical branch is oriented in a transverse extension of the channel.

3. The integrated circuit according to claim 2, wherein an axis of symmetry of the vertical branch is substantially aligned with a transverse axis of the channel.

4. The integrated circuit according to claim 1, wherein a width of the horizontal branch, measured in the transverse direction of the channel, is less than or equal to a third of a length of the horizontal branch, measured in the longitudinal direction of the channel.

5. The integrated circuit according to claim 2, wherein a width of the vertical branch, measured in the longitudinal direction of the channel, is substantially equal to a length of the channel.

6. The integrated circuit according to claim 1, wherein the at least one basic pattern is made of metal.

7. The integrated circuit according to claim 1, further comprising at least one metallization level, wherein the at least one basic pattern extends between the area of insulating region and the at least one metallization level.

8. The integrated circuit according to claim 1, further comprising at least one metallization level, wherein a gate region of the transistor encroaches over the area of insulating region and wherein the at least one basic pattern is formed in the at least one metallization level above the gate region.

9. The integrated circuit according to claim 1, further comprising several metallization levels, wherein at least one basic pattern comprises an assembly of a plurality of basic patterns stacked on top of each other, with certain basic patterns formed in at least one of the metallization levels.

10. The integrated circuit according to claim 9, further comprising at least one via disposed between two basic patterns.

11. The integrated circuit according to claim 10, wherein the at least one via has the shape of a T.

12. An integrated circuit, comprising:
a substrate including an active region oriented along a crystallographic face (100) of the substrate;
an insulating region in substrate which delimits the active region;
a MOS transistor having a channel formed in the active region of the substrate and oriented longitudinally along a crystallographic direction of the <110> type, the channel having a length and width; and
a channel stressing structure made of a metal material which is electrically inactive and located above the insulating region adjacent an end of the channel, the channel stressing structure having a first metal segment having a length oriented parallel to the channel length and a second metal segment having a width oriented parallel to the channel width;
wherein the length of the first metal segment is in excess of the channel length.

13. The integrated circuit of claim 12, wherein the first metal segment is located between the channel region and the second metal segment.

14. The integrated circuit of claim 12, wherein the MOS transistor has a gate formed above the substrate on an oxide layer, and wherein the first and second metal segments of the channel stressing structure are formed on said oxide layer.

15. The integrated circuit of claim 12, further comprising a plurality of metallization levels formed over the substrate, wherein the first and second metal segments of the channel stressing structure are formed within at least one of said metallization levels.

16. The integrated circuit of claim 12, wherein the channel region has a transverse axis oriented parallel to the channel width, and wherein centers of the first and segment metal segments are aligned with the transverse axis.

17. The integrated circuit of claim 12, wherein the metal material comprises tungsten.

18. The integrated circuit of claim 12, wherein a length of the second metal segment is substantially equal to the channel length.

19. The integrated circuit of claim 12, wherein the first and second metal segments are joined together in a "T" shape.

20. The integrated circuit of claim 12, wherein the length of the first metal segment exceeds a width of the first metal segment, and wherein the width of the second metal segment exceeds a length of the second metal segment.

* * * * *